(12) United States Patent
Li et al.

(10) Patent No.: US 11,069,264 B2
(45) Date of Patent: Jul. 20, 2021

(54) COVER STRUCTURE, MANUFACTURING METHOD THEREOF AND DISPLAY DEVICE

(71) Applicant: BOE TECHNOLOGY GROUP CO., LTD., Beijing (CN)

(72) Inventors: Jianwei Li, Beijing (CN); Pao Ming Tsai, Beijing (CN); Shuang Du, Beijing (CN); Hong Li, Beijing (CN); Dejun Bu, Beijing (CN); Liqiang Chen, Beijing (CN); Lu Liu, Beijing (CN); Peng Cai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 169 days.

(21) Appl. No.: 15/991,117

(22) Filed: May 29, 2018

(65) Prior Publication Data

US 2019/0051223 A1 Feb. 14, 2019

(30) Foreign Application Priority Data

Aug. 11, 2017 (CN) .......................... 201710686791.1

(51) Int. Cl.
*G06F 9/30* (2018.01)
*H01L 51/00* (2006.01)
(Continued)

(52) U.S. Cl.
CPC ................ *G09F 9/301* (2013.01); *B32B 3/30* (2013.01); *B32B 7/12* (2013.01); *B32B 17/064* (2013.01);
(Continued)

(58) Field of Classification Search
CPC ......... H01L 2251/5338; H01L 51/0097; H01L 51/524; B32B 7/12; B32B 2307/412;
(Continued)

(56) References Cited

U.S. PATENT DOCUMENTS

2017/0092884 A1* 3/2017 Zhang ................ H01L 51/0097

FOREIGN PATENT DOCUMENTS

CN 203689475 U 7/2014
CN 106313835 A 1/2017
(Continued)

OTHER PUBLICATIONS

First Office Action for Chinese Patent Application No. 201710686791.1 dated Apr. 1, 2019.

*Primary Examiner* — Catherine A. Simone
(74) *Attorney, Agent, or Firm* — Calfee, Halter & Griswold LLP

(57) ABSTRACT

The present disclosure discloses a cover structure, a manufacturing method thereof and a display device. The cover structure includes a first and a second transparent flexible film layer, a glass panel, and a first optical adhesive layer. The first transparent flexible film layer has a folded region and a non-folded region. The glass panel is disposed on the first transparent flexible film layer, and a projection of the glass panel on the first transparent flexible film layer is located inside the non-folded region. A part of the first optical adhesive layer is formed at a side of the glass panel facing away from the first transparent flexible film layer, and a part of the first optical adhesive layer covers the folded region of the first transparent flexible film layer. The second transparent flexible film layer is formed at a side of the first optical adhesive layer facing away from the first transparent flexible film layer.

7 Claims, 3 Drawing Sheets

(51) Int. Cl.
*B23B 7/12* (2006.01)
*H05K 5/03* (2006.01)
*H01L 51/52* (2006.01)
*B32B 17/06* (2006.01)
*B32B 3/30* (2006.01)
*G09F 9/30* (2006.01)
*B32B 7/12* (2006.01)
*G02B 1/11* (2015.01)
*B32B 27/28* (2006.01)
*B32B 27/06* (2006.01)

(52) U.S. Cl.
CPC .......... *B32B 27/06* (2013.01); *B32B 27/281* (2013.01); *G02B 1/11* (2013.01); *H01L 51/0097* (2013.01); *H01L 51/524* (2013.01); *H05K 5/03* (2013.01); *B32B 2307/412* (2013.01); *G02F 2202/28* (2013.01); *H01L 2251/5338* (2013.01)

(58) Field of Classification Search
CPC ......... B32B 3/30; B32B 27/06; B32B 27/281; B32B 17/064; G09F 9/301; H05K 5/03; G02B 1/11; G02F 2202/28
See application file for complete search history.

(56) References Cited

FOREIGN PATENT DOCUMENTS

| | | |
|---|---|---|
| CN | 106328003 A | 1/2017 |
| CN | 206020895 U | 3/2017 |
| CN | 106610741 A | 5/2017 |
| CN | 106698967 A | 5/2017 |
| CN | 106816530 A | 6/2017 |
| CN | 106886253 A | 6/2017 |

* cited by examiner

COVER STRUCTURE, MANUFACTURING METHOD THEREOF AND DISPLAY DEVICE

CROSS-REFERENCE TO RELATED APPLICATIONS

This application is based on and claims priority to Chinese Patent Application No. 201710686791.1, filed on Aug. 11, 2017, the content of which is incorporated herein by reference in its entirely.

TECHNICAL FIELD

The present disclosure relates to the technical field of display devices, in particular to a cover structure, a manufacturing method thereof and a display device.

BACKGROUND

Foldable display devices are popular on the market and are widely used in the field of display devices.

However, a foldable display cover plate in a foldable display panel faces a great challenge of how to have both better bending performance and better mechanical property. In general, the foldable display cover plate in a general concept cannot have both better bending performance and stronger surface hardness and impact resistance. A flexible display cover plate currently using a flexible thin film and a surperhard hardened layer structure has higher surface hardness (generally up to 7H), but has poorer bending performance (generally only a bending with more than 10 mm of a bending diameter may be realized). A flexible display cover plate having a flexible thin film with better bending performance and a hardened layer has a poorer surface hardness (generally only 2H). None of display cover plates mentioned above has stronger external impact resistance.

SUMMARY

The present disclosure provides a cover structure and a manufacturing method thereof, and a display device. The cover structure mentioned above utilizes optimization of its structure so as to make both bending performance and impact resistance of the entire cover structure better.

In order to achieve the objective mentioned above, the present disclosure provides the following technical solutions:

a cover structure including:

a first transparent flexible film layer having a folded region and a non-folded region;

a glass panel disposed at a side of the first transparent flexible film layer, and a projection of the glass panel on a side of the first transparent flexible film layer is located inside the non-folded region;

a first optical adhesive layer, a part of the first optical adhesive layer being formed at a side of the glass panel facing away from the first transparent flexible film layer, and a part of the first optical adhesive layer covering the folded region of the first transparent flexible film layer; and a second transparent flexible film layer formed at a side of the first optical adhesive layer facing away from the first transparent flexible film layer.

According to an embodiment of the present disclosure, the glass panel is adhered to the first transparent flexible film layer.

According to an embodiment of the present disclosure, an adhesive material between the glass panel and the first transparent flexible film layer is an optical adhesive.

According to an embodiment of the present disclosure, the cover structure further includes an anti-glare layer formed at a side of the first transparent flexible film layer facing away from the second transparent flexible film layer.

According to an embodiment of the present disclosure, a side of the anti-glare layer facing away from the first transparent flexible film layer is formed with a plurality of protruding structures.

According to an embodiment of the present disclosure, material of each of the first transparent flexible film layer and the second transparent flexible film layer is polyimide.

According to an embodiment of the present disclosure, the cover structure further includes a decorative ink layer disposed at a side of the second transparent flexible film layer facing away from the first transparent flexible film layer.

The present disclosure further provides a manufacturing method of a cover structure for manufacturing the cover structure in any of technical solutions mentioned above, the manufacturing method including:

providing a glass panel on a non-folded region at a side of a first transparent flexible film layer;

providing a first optical adhesive layer on the glass panel, in which a part of the first optical adhesive layer being formed at a side of the glass panel facing away from the first transparent flexible film layer, in which a part of the first optical adhesive layer covering a folded region of the first transparent flexible film layer and the first optical adhesive layer covering the folded region of the first transparent flexible film layer; and forming a second transparent flexible film layer on the first optical adhesive layer.

According to an embodiment of the present disclosure, the manufacturing method of the cover structure further includes:

coating an anti-glare particle layer on a side of the first transparent flexible film layer facing away from the second transparent flexible film layer by means of slit coating; and forming an anti-glare layer by providing a baking process for the anti-glare particle layer.

According to an embodiment of the present disclosure, the manufacturing method of the cover structure further includes forming a second optical adhesive layer between the first transparent flexible film layer and the glass panel.

According to an embodiment of the present disclosure, the manufacturing method of the cover structure further includes forming a decorative ink layer on the second transparent flexible film layer by means of baking process.

The present disclosure further includes a display device including the cover structure in any of technical solutions mentioned above.

DETAILED DESCRIPTION

In the following, technical solutions in embodiments of the present disclosure will be clearly and fully described with reference to the accompanying drawings in the embodiments of the present disclosure. Obviously, the embodiments are merely part but not all of embodiments of the present disclosure. Based on embodiments in the present disclosure, other embodiments will be made by those skilled in the art without any creative work, and shell fall within the protection scope of the present disclosure.

Figure 1:
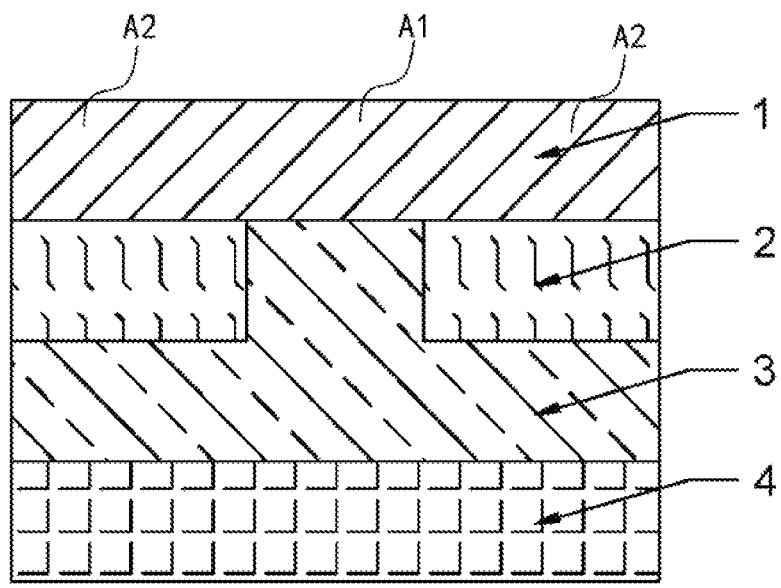
FIG. 1 is a schematic view of a cover structure provided according to an embodiment of the present disclosure.

Referring to FIG. 1, the present disclosure provides a cover structure including a first transparent flexible film layer 1, a glass panel 2, a first optical adhesive layer 3 and a second transparent flexible film layer 4.

The first transparent flexible film layer 1 has a folded region A1 and a non-folded region A2. The glass panel 2 is disposed at a side of the first transparent flexible film layer 1, and a projection of the glass panel 2 on a side of the first transparent flexible film layer 1 is located inside the non-folded region. The first optical adhesive layer 3 is formed at a side of the glass panel 2 facing away from the first transparent flexible film layer 1. The second transparent flexible film layer 4 is formed at a side of the first optical adhesive layer 3 facing away from the first transparent flexible film layer 1.

The present disclosure provides a cover structure. The cover structure includes: a first transparent flexible film layer 1; a glass panel 2, the glass panel 2 being disposed at the first transparent flexible film layer 1 and a projection on the first transparent flexible film layer 1 being located inside the non-folded region A2; a first optical adhesive layer 3 formed at a side of the glass panel 2 facing away from first transparent flexible film layer 1; and a second transparent flexible film layer 4 formed at a side of the first optical adhesive layer 3 facing away from first transparent flexible film layer 1. The first transparent flexible film layer 1 has the folded region A1 and the non-folded region A2, and the folded region A1 of the first transparent flexible film layer 1 is not provided with the glass panel 2, therefore, in case of a force is applied on the cover structure by an user when bending the cover structure provided by the present disclosure, the folded region A1 of the first transparent flexible film layer 1 has higher flexibility, which could satisfy bending requirements of the cover structure, and optimize bending performance of the cover structure. When an external impact is applied to the cover structure provided by the present disclosure, as the non-folded region A2 of the first transparent flexible film layer 1 is provided with the glass panel 2 having higher hardness, the glass panel 2 arranged on the non-folded region A2 of the first transparent flexible film layer 1 may bear the external impact, thereby optimizing impact resistance performance of the cover structure provided by the present disclosure.

The cover structure is provided with the folded region A1 and non-folded region A2 on the first transparent flexible film layer 1 and the glass panel 2 is arranged on a corresponding position of the non-folded region A2, so that the entire cover structure has both better bending performance and stronger external impact resistance.

Therefore, the cover structure utilizes optimization of its structure so as to make both bending performance and impact resistance of the entire cover structure better.

Based on technical solutions mentioned above, optionally, the folded region and the non-folded region of the first transparent flexible film layer are alternately arranged.

Specifically, the folded region and the non-folded region on the first transparent flexible film layer are distributed more evenly. When benging stress and impact are applied to the cover structure provided by the present disclosure, the stress of entire cover structure becomes more well-distributed. This structure further optimizes the bending performance and external impact resistance of the cover structure provided by the present disclosure.

In addition, the first optical adhesive is a high-tenacity optical adhesive. The first optical adhesive not only serves as an optical transparent adhesive to connect the previous structure with a second transmittance flexible film layer, but also is functioned to fill a gap of the folded region.

Based on technical solutions mentioned above, the glass panel 2 is adhered to the first transparent flexible film layer 1.

It should be noted that, adhering is a continuous surface connection, which reduces stress concentration, ensures strength of the cover structure provided by the present disclosure, and improves fatigue life of the structure.

Based on technical solutions mentioned above, adhesive material of end of the glass panel 2 and the first transparent flexible film layer 1 is an optical adhesive.

It should be noted that, the optical adhesive has the following advantages: it is colorless and transparent, has a light transmittance of 90% or more and a good adhering strength, and may be cured in a room temperature or moderate temperature with a small curing shrinkage. Organic silicone, crylic acid resin, unsaturated polyester, polyurethane, epoxy and other adhesives may be used as an optical adhesive.

In addition, some treating agents are generally added during preparing the optical adhesive to improve its optical performance or reduce curing shrinkage rate.

Figure 2:
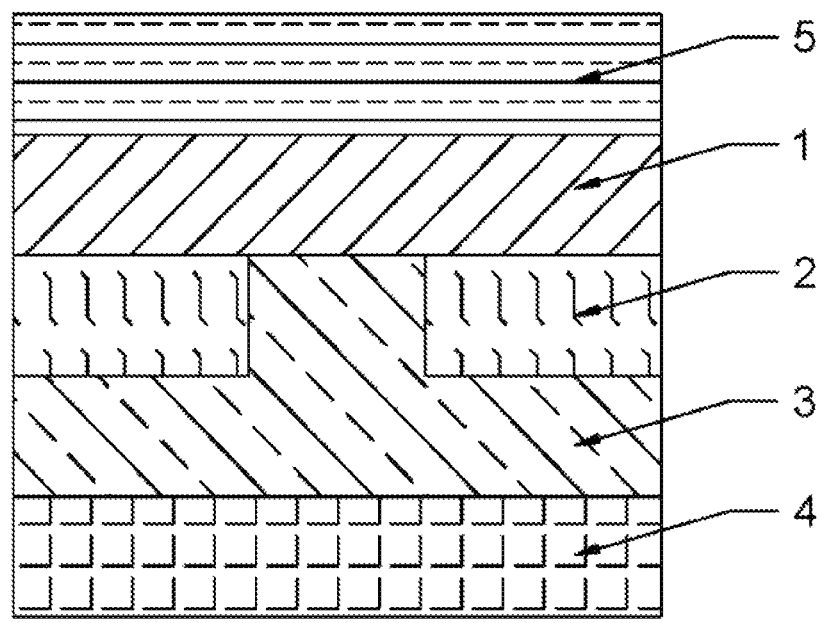
FIG. 2 is a schematic view of the cover structure of FIG. 1 after adding an anti-glare layer.

Based on technical solutions mentioned above, optionally, and referring to FIG. 2, the cover structure provided by the present disclosure further includes an anti-glare layer 5 formed at a side of the first transparent flexible film layer 1 facing away from the second transparent flexible film layer 4.

It should be noted that there are many possibilities for a material of the anti-glare layer 5. Optionally, the anti-glare layer 5 includes a thermoplastic resin composition or a photochemical radiation solid resin composition.

Based on technical solutions mentioned above, a side of the anti-glare layer 5 facing away from the first transparent flexible film layer 1 is formed with a plurality of protruding structures.

Figure 3:
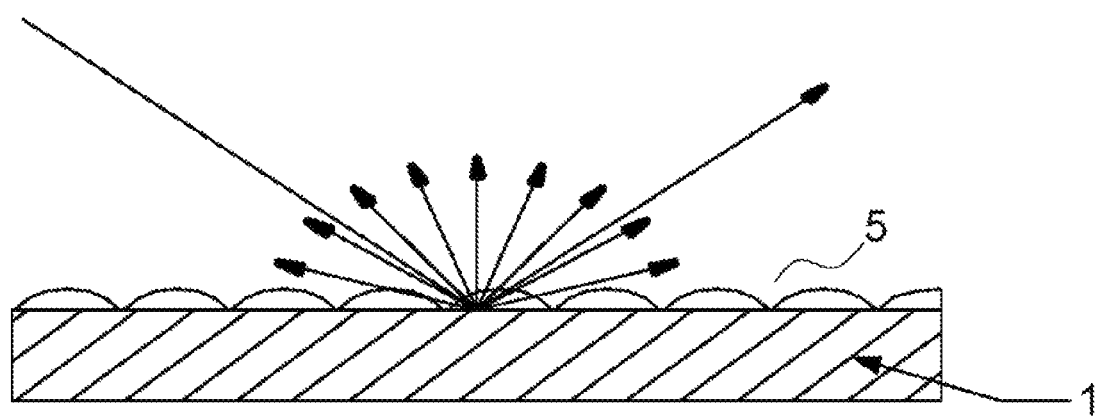
FIG. 3 is a schematic view of a function of the anti-glare layer of FIG. 2.

It should be noted that Referring to FIG. 3, the anti-glare layer 5 includes a plurality of anti-glare particles. A diffuse reflection occurs when light passes through anti-glare particles, which may ensure the display device having a distinct display image even in a sunny outdoor environment. Meanwhile, the anti-glare layer 5 may eliminate a boundary effect between the folded region and non-folded region caused by specular reflections, thereby leading to homogenization of an optical effect of an integrated display device.

Based on technical solutions mentioned above, it should be noted that material of each of the first transparent flexible film layer 1 and the second transparent flexible film layer 4 is polyimide. The mentioned material has better bending performance, mechanical performance and optical performance, so that bending performance and external impact resistance of the cover structure provided by the present disclosure may be enhanced.

Figure 4:
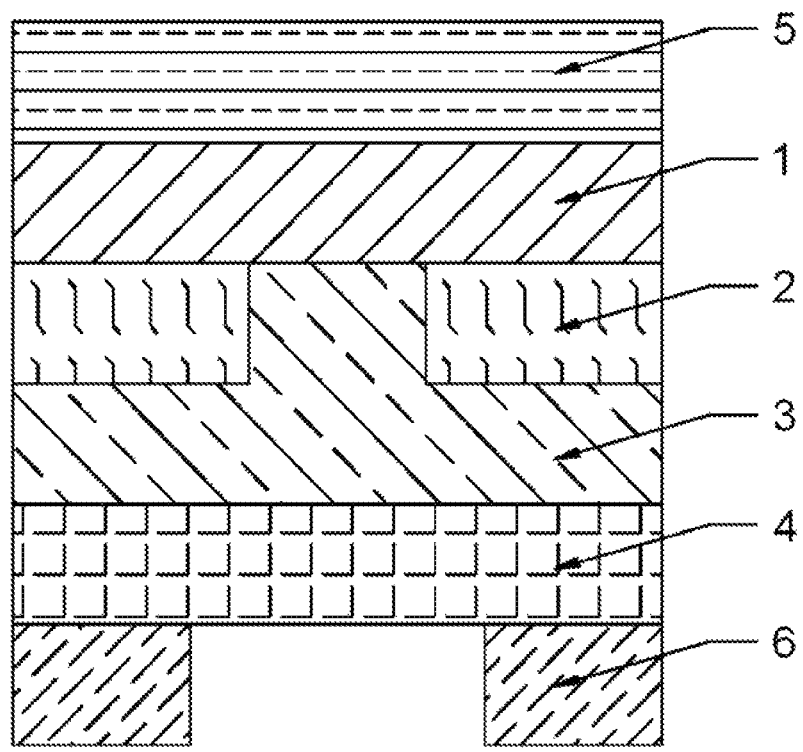
FIG. 4 is a schematic structural view of the cover structure of FIG. 2 after adding a decorative ink layer.

Based on technical solutions mentioned above, and referring to FIG. 4, the cover structure provided by the present disclosure further includes a decorative ink layer 6 disposed at a side of the second transparent flexible film layer 4 facing away from the first transparent flexible film layer 1.

It should be noted that, the decorative ink layer 6 may improve ornamentality of the cover structure provided by the present disclosure to make it more artistic.

Figure 5A:
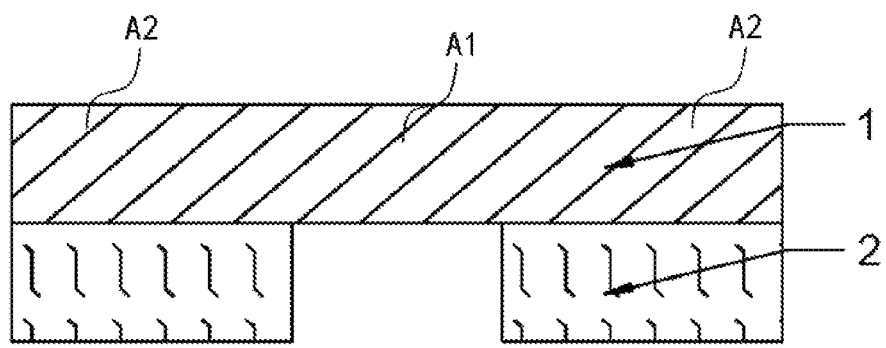
FIGS. 5a-5c are process flow diagrams of the manufacturing method of the cover structure according to an embodiment oft the present disclosure.
Figure 5B:
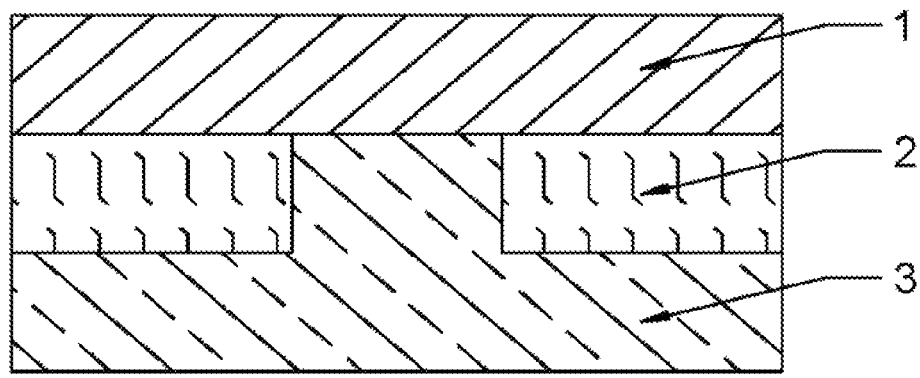
Figure 5C:
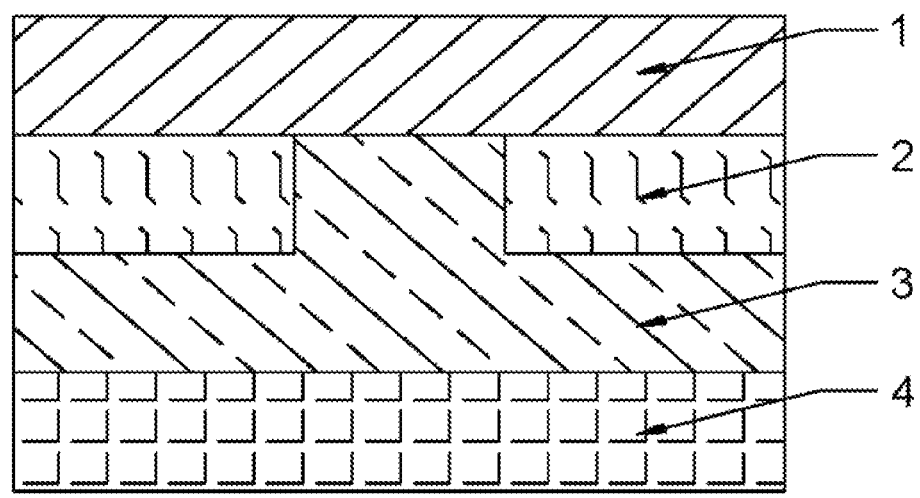

The present disclosure further provides a manufacturing method of a cover structure for manufacturing the cover structure in any of technical solutions mentioned above, the manufacturing method including:

referring to FIG. 5a, providing a glass panel 2 on a non-folded region A2 at a side of the first transparent flexible film layer 1;

referring to FIG. 5b, providing a first optical adhesive layer 3, in which a part of the first optical adhesive layer 3 being formed at a side of the glass panel 2 facing away from the first transparent flexible film layer 1, and in which a part of the first optical adhesive layer 3 covering a folded region A1 of the first transparent flexible film layer 1;

referring to FIG. 5c, forming a second transparent flexible film layer 4 on a side of the first optical adhesive layer 3 facing away from the first transparent flexible film layer 1.

Based on technical solutions mentioned above, and further referring to FIG. 2, the manufacturing method of the cover structure further includes:

coating an anti-glare particle layer on a side of the first transparent flexible film layer 1 facing away from the second transparent flexible film layer 4 by means of slit coating;

forming an anti-glare layer 5 by providing a baking process for the anti-glare particle layer.

It should be noted that, this structure may ensure a good adhering effect of the anti-glare layer 5 formed by baking process when formed on the first transparent flexible film layer 1, thereby enhancing stability of the cover structure made by the manufacturing method.

Based on technical solutions mentioned above, the manufacturing method of the cover structure further includes forming a second optical adhesive layer between the first transparent flexible film layer 1 and the glass panel 2.

It should be noted that, the second optical adhesive layer is functioned to adhere the first transparent flexible film layer 1 with the glass panel 2, which is a basic step for performing the manufacturing method of the cover structure provided by the present disclosure.

Based on technical solutions mentioned above, and further referring to FIG. 4, the manufacturing method of cover structure further includes forming a decorative ink layer 6 on the second transparent flexible film layer 4 by means of baking process.

The present disclosure further provides a display device, including the cover structure in any of technical solutions mentioned above.

According to technical solutions mentioned above, the first transparent flexible film layer has the folded region and the non-folded region and the folded region of the first transparent flexible film layer is not provided with the glass panel, therefore, in case of a force is applied on the cover structure by an user when bending the cover structure provided by the present disclosure, the folded region of the first transparent flexible film layer has higher flexibility, which could satisfy bending requirements of the cover structure, and optimize bending performance of the cover structure. When an external impact is applied to the cover structure provided by the present disclosure, as the non-folded region of the first transparent flexible film layer is provided with the glass panel having higher hardness, the glass panel arranged on the non-folded region of the first transparent flexible film layer 1 may bear the external impact, thereby optimizing impact resistance performance of the cover structure provided by the present disclosure.

The cover structure is provided with the folded region and non-folded region on the first transparent flexible film layer and the glass panel is arranged on a corresponding position of the non-folded region, so that the entire cover structure has both better bending performance and stronger external impact resistance.

Therefore, the cover structure utilizes optimization of its structure so as to make both bending performance and impact resistance of the entire cover structure better.

Obviously, various modification and variations may be made to the embodiments of the present disclosure by those skilled in the art without departing from the spirit and scope of the present disclosure. Thus, if these modifications and variations of the present disclosure fall within the scope of claims or their equivalent technologies, the present disclosure may also be intended to include these modifications and variations.

What is claimed is:

1. A cover structure, comprising:
   a first transparent flexible film layer having a folded region and a non-folded region;
   a glass panel directly contacts a side of the first transparent flexible film layer, wherein a projection of the glass panel on a side of the first transparent flexible film layer is located inside the non-folded region and the folded region of the first transparent flexible film layer is not provided with the glass panel;
   a first optical adhesive layer, wherein the first optical adhesive layer is a single structure, and a part of the first optical adhesive layer is formed at a side of the glass panel facing away from the first transparent flexible film layer, and a part of the first optical adhesive layer directly contacts the folded region of the first transparent flexible film layer and directly contacts side surfaces of the glass panel;
   a second transparent flexible film layer formed at a side of the first optical adhesive layer facing away from the first transparent flexible film layer and directly contacts the first optical adhesive layer; and
   an anti-glare layer formed at a side of the first transparent flexible film layer facing away from the second transparent flexible film layer and directly contacts the first transparent flexible film layer;
   wherein the first optical adhesive layer is colorless and transparent, has a light transmittance of 90% or more;
   the anti-glare layer is configured to eliminate a boundary effect between the folded region and non-folded region caused by specular reflections, thereby leading to homogenization of an optical effect of an integrated display device.

2. The cover structure according to claim 1, wherein the glass panel is adhered to the first transparent flexible film layer.

3. The cover structure according to claim 2, wherein an adhesive material between the glass panel and the first transparent flexible film layer is an optical adhesive.

4. The cover structure according to claim 1, wherein material of each of the first transparent flexible film layer and the second transparent flexible film layer is polyimide.

5. A manufacturing method of a cover structure for manufacturing the cover structure according to claim 1, wherein the manufacturing method comprises:

providing a glass panel on a non-folded region at a side of a first transparent flexible film layer;

providing a first optical adhesive layer on the glass panel, wherein the first optical adhesive layer is a single structure and a part of the first optical adhesive layer is formed at a side of the glass panel facing away from the first transparent flexible film layer, a part of the first optical adhesive layer covers a folded region of the first transparent flexible film layer and the first optical adhesive layer covers folded region of the first transparent flexible film layer;

forming a second transparent flexible film layer on the first optical adhesive layer;

creating an anti-glare particle layer on a side of the first transparent flexible film layer facing away from the second transparent flexible film layer by means of slit coating, forming an anti-glare layer by providing a baking process for the anti-glare particle layer; and forming a decorative ink layer on the second transparent flexible film layer by means of baking process, wherein a side of the anti-glare layer facing away from the first transparent flexible film layer is formed with a plurality of protruding structures.

6. The manufacturing method according to claim 5, further comprising forming a second optical adhesive layer between the first transparent flexible film layer and the glass panel.

7. A display device, wherein the display device comprises the cover structure according to claim 1.

* * * * *